United States Patent
Perner et al.

(10) Patent No.: US 7,079,438 B2
(45) Date of Patent: Jul. 18, 2006

(54) CONTROLLED TEMPERATURE, THERMAL-ASSISTED MAGNETIC MEMORY DEVICE

(75) Inventors: Frederick A. Perner, Palo Alto, CA (US); Manoj K. Bhattacharyya, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 332 days.

(21) Appl. No.: 10/779,909

(22) Filed: Feb. 17, 2004

(65) Prior Publication Data

US 2005/0180238 A1    Aug. 18, 2005

(51) Int. Cl.
*G11C 7/04* (2006.01)

(52) U.S. Cl. .............. 365/211; 365/212; 365/213; 365/210

(58) Field of Classification Search ........... 365/211, 365/212, 213, 158, 210
See application file for complete search history.

(56) References Cited

U.S. PATENT DOCUMENTS

| 6,111,783 | A | 8/2000 | Tran et al. |
| 6,185,143 | B1 | 2/2001 | Perner et al. |
| 6,317,376 | B1 | 11/2001 | Tran et al. |
| 6,608,790 | B1 | 8/2003 | Tran et al. |
| 6,687,178 | B1 | 2/2004 | Qi et al. |
| 6,775,196 | B1 * | 8/2004 | Perner et al. ............ 365/211 |
| 6,791,865 | B1 * | 9/2004 | Tran et al. .............. 365/158 |
| 6,868,025 | B1 * | 3/2005 | Hsu ....................... 365/211 |

* cited by examiner

*Primary Examiner*—Son T. Dinh (57) ABSTRACT

This invention provides a controlled temperature, thermal-assisted magnetic memory device. In a particular embodiment, there is an array of SVM cells, each characterized by an alterable orientation of magnetization and including a material wherein the coercivity is decreased upon an increase in temperature. In addition, at least one reference SVM (RSVM) cell substantially similar to and in close proximity to the SVM cells of the array is provided. A provided feedback control temperature controller receives a feedback voltage from the reference SVM cell, corresponding to temperature, and adjusts power applied to the RSVM cell and SVM cell. An associated method of use is further provided.

45 Claims, 5 Drawing Sheets

CONTROLLED TEMPERATURE, THERMAL-ASSISTED MAGNETIC MEMORY DEVICE

FIELD OF THE INVENTION

This invention relates generally to magnetic memory devices, and in particular to ultra-high density thermally assisted magnetic random access memory arrays (commonly referred to as "MRAM").

BACKGROUND OF THE INVENTION

Today's computer systems are becoming increasingly sophisticated, permitting users to perform an ever greater variety of computing tasks at faster and faster rates. The size of the memory and the speed at which it can be accessed bear heavily upon the overall speed of the computer system.

Memory for a computer system is technically any form of electronic, magnetic or optical storage; however, it is generally divided up into different categories based in part upon speed and functionality. The two general categories of computer memory are main memory and mass storage. Main memory is generally comprised of fast, expensive volatile random access memory that is connected directly to the processor by a memory bus. One contributor to the speed in main memory is generally the ability to access a particular memory cell without physical movement of components.

Generally, the principle underlying the storage of data in magnetic media (main or mass storage) is the ability to change and/or reverse the relative orientation of the magnetization of a storage data bit (i.e. the logic state of a "0" or a "1"). The coercivity of a material is the level of demagnetizing force that must be applied to a magnetic particle to reduce and/or reverse the magnetization of the particle.

Figure 1A:
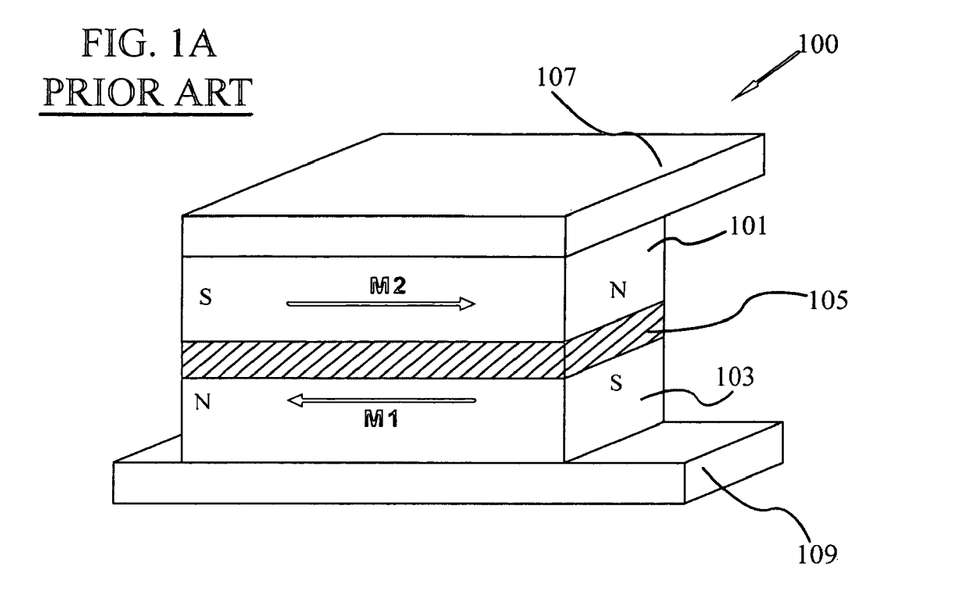
FIGS. 1A–1B provide perspective views of a prior art magnetic memory cell.
Figure 1B:
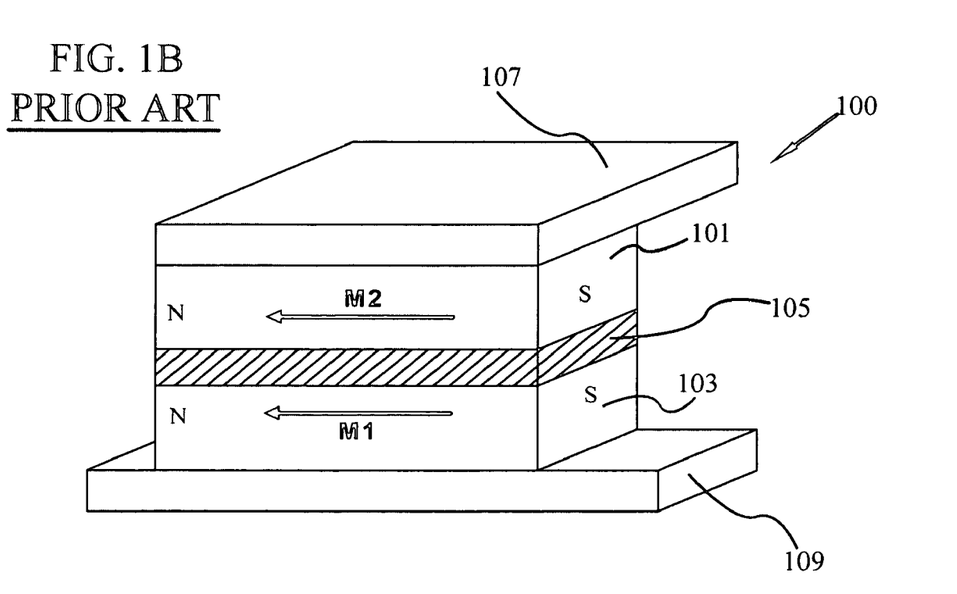

A prior art magnetic memory cell may be a tunneling magneto-resistance memory cell (TMR), a giant magneto-resistance memory cell (GMR), or a colossal magneto-resistance memory cell (CMR). These types of magnetic memory are commonly referred to as spin valve memory cells (SVM). FIGS. 1A and 1B provide a perspective view of a typical prior art magnetic memory cell having two conductors.

As shown in prior art FIGS. 1A and 1B, a magnetic spin valve memory cell 100 generally includes a data layer 101 (also called a storage layer or bit layer), a reference layer 103, and an intermediate layer 105 between the data layer 101 and the reference layer 103. The data layer 101, the reference layer 103, and the intermediate layer 105 can be made from one or more layers of material. Electrical current and magnetic fields may be provided to the SVM cell 100 by an electrically conductive row conductor 107 and an electrically conductive column conductor 109.

In a typical MRAM device, the SVM cells are arranged in a cross-point array. Parallel conductive columns (column 1, 2, 3 . . . ), also referred to as word lines, cross parallel conductive rows (row A, B, C . . . ), also referred to as bit lines. The traditional principles of column and row arrays dictate that any given row will only cross any given column once.

An SVM cell is placed at each intersecting cross-point between a row and column. By selecting a particular row (B) and a particular column (3), any one memory cell positioned at their intersection (B,3) can be isolated from any other memory cell in the array. Such individual indexing is not without complexities. A typical MRAM cross-point array may easily consist of at least 1,000 rows and 1,000 columns uniquely addressing 1,000,000 SVM cells.

The data layer 101 is usually a layer of magnetic material that stores a bit of data as an orientation of magnetization M2 that may be altered in response to the application of an external magnetic field or fields. More specifically, the orientation of magnetization M2 of the data layer 101 representing the logic state can be rotated (switched) from a first orientation, representing a logic state of "0", to a second orientation, representing a logic state of "1", and/or vice versa.

The reference layer 103 is usually a layer of magnetic material in which an orientation of magnetization M1 is "pinned", as in fixed, in a predetermined direction. The direction is predetermined and established by microelectronic processing steps employed in the fabrication of the magnetic memory cell.

Typically, the logic state (a "0" or a "1") of a magnetic memory cell depends on the relative orientations of magnetization in the data layer 101 and the reference layer 103. For example, when an electrical potential bias is applied across the data layer 101 and the reference layer 103 in an SVM cell 100, electrons migrate between the data layer 101 and the reference layer 103 through the intermediate layer 105. The intermediate layer 105 is typically a thin dielectric layer commonly referred to as a tunnel barrier layer. The phenomena that cause the migration of electrons through the barrier layer may be referred to as quantum mechanical tunneling, or spin tunneling.

The logic state may be determined by measuring the resistance of the memory cell. For example, if the overall orientation of the magnetization in the data layer 101 is parallel to the pinned orientation of magnetization in the reference layer 103 the magnetic memory cell will be in a state of low resistance, R.

If the overall orientation of the magnetization in the data layer 101 is anti-parallel (opposite) to the pinned orientation of magnetization in the reference layer 103, the magnetic memory cell will be in a state of high resistance R+$\Delta$R. The orientation of M2 and, therefore, the logic state of the SVM cell 100 may be read by sensing the resistance of the SVM cell 100.

With respect to coercivity, generally speaking, the smaller the magnetic particle, the higher its coercivity. A large coercivity is generally undesirable as it requires a greater magnetic field to facilitate switching, which in turn requires a greater power source and potentially larger conductors. Providing a large power source and large conductors is generally at odds with the attempts to reduce the necessary size of components, and therefore permit larger memory stores in smaller and smaller spaces.

In addition, the coercivity of a magnetic particle may also be affected by temperature. Generally, as temperature increases, coercivity decreases. With respect to MRAM and SVM cells, elevating the temperature of an SVM cell may indeed reduce the coercivity. In an MRAM array, switching the magnetic orientation of a specific cell without substantially disturbing the others can be facilitated by heating the selected cell, and thus lowering that particular SVM cell's coercivity. Such a heated SVM cell may then be switched by a field that is insufficient to affect unselected neighboring SVM cells.

However, environmental factors may significantly affect the SVM cell. Heat applied to an SVM cell in one setting to reduce it's coercivity may be ineffective in another, i.e., where the cell is extremely cold.

Likewise, where the ambient temperature is extremely warm, additional heat (and the switching field itself) may inadvertently affect more than the specifically intended SVM cell. The variable of ambient temperature and the effect on the operation of the MRAM can therefore degrade proper operation of the SVM cells.

In a typical MRAM array, a significant amount of overall space may be used simply to provide a physical buffer between the cells. Eliminating this buffering space, or reducing its ratio, could provide a greater volume of storage in the same physical space Hence, there is a need for an ultra-high density thermally assisted memory array which overcomes one or more of the drawbacks identified above. The present invention satisfies this need.

SUMMARY

This invention provides a controlled temperature, thermal-assisted magnetic memory device for use as an ultra-high density memory array.

In particular, and by way of example only, according to an embodiment of the present invention, this invention provides a controlled temperature, thermal-assisted magnetic memory device including: an array of SVM cells, the SVM cells characterized by an alterable orientation of magnetization and including a material wherein the coercivity is decreased upon an increase in temperature; at least one reference SVM cell; and a feedback controlled temperature controller receiving a reference voltage and receiving feedback a voltage from the reference SVM cell when power is applied to the reference SVM cell and a selected array SVM cell to heat the reference SVM cell and the selected array SVM cell, the feedback controlled temperature controller adjusting the applied power to minimize the difference between the feedback voltage and reference voltage.

In yet another embodiment, the invention may provide a method of performing a write operation on a selected SVM cell in a controlled temperature, thermal-assisted memory device consisting of an array of SVM cells wherein their coercivity is decreased upon an increase in temperature, a reference SVM cell substantially similar to and in close proximity to the array, and a feedback controlled temperature controller having a temperature sensor thermally coupled to the reference SVM cell, the method including: selecting a specific SVM cell from the array; applying a first power to the reference SVM cell, the first power heating the reference SVM cell; applying a second power, substantially identical to the first power, to the selected SVM cell, the second power heating selected SVM cell; sensing a feedback voltage from the temperature sensor coupled to the reference SVM cell; comparing the feedback voltage to a reference voltage; adjusting the first power applied to the reference SVM cell to minimize the difference between the feedback voltage and the reference voltage; adjusting the second power applied to the selected SVM cell to be substantially identical to the adjusted first voltage; and applying a magnetic field to the selected SVM cell; wherein the orientation of magnetization of the selected array SVM cell may be changed, the magnetic field being greater than the coercivity of the heated selected array SVM cell.

These and other objects, features and advantages of the preferred method and apparatus will become apparent from the following detailed description, taken in conjunction with the accompanying drawings which illustrate, by way of example, the principles of the invention.

DETAILED DESCRIPTION

Before proceeding with the detailed description, it is to be appreciated that the present invention is not limited to use or application with a specific type of magnetic memory. Thus, although the present invention is, for the convenience of explanation, depicted and described with respect to typical exemplary embodiments, it will be appreciated that this invention may be applied with other types of magnetic memory.

Figure 2:
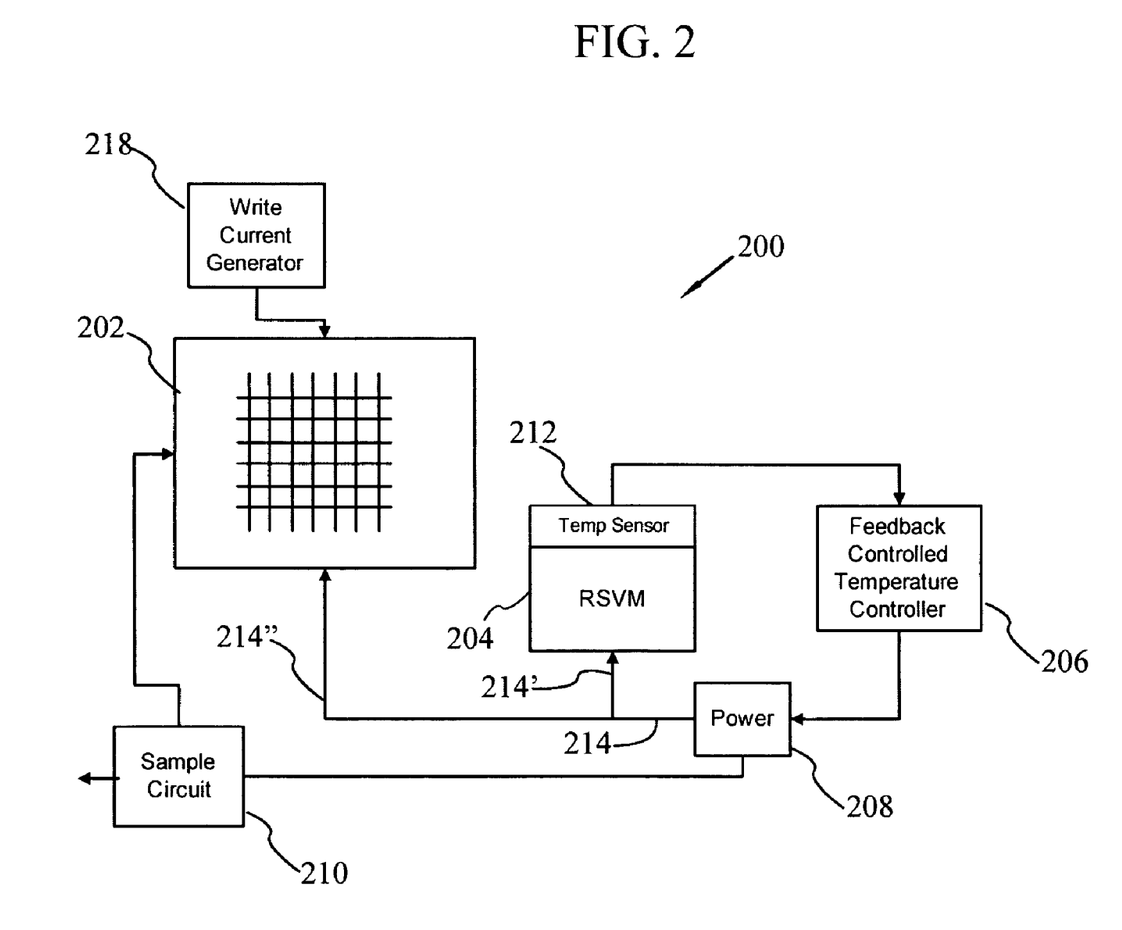
FIG. 2 is a block diagram of the controlled temperature, thermal-assisted magnetic memory device according to the present invention.

Referring now to the drawings, and more particularly to FIG. 2, there is shown a portion of a controlled temperature, thermal-assisted magnetic memory device 200, including an array 202 of spin valve memory (SVM) cells, at least one reference SVM (RSVM) cell 204, and a feedback controlled temperature controller 206. The thermal-assisted magnetic memory device 200 may further include a power source 208 and a sampling circuit 210, such as a self-reference triple sample sense circuit providing a digital output representing the state of a selected resistive device within the array 202. A write current generator 218 may also be provided.

Coupled to the RSVM cell 204 is a temperature sensor 212. The temperature sensor 212 is thermally coupled to the RSVM cell 204, and in at least one embodiment, is physically coupled to the RSVM cell 204. The feedback controlled temperature controller 206 receives feedback in the form of a voltage feedback from the temperature sensor 212. The feedback is generated when power is applied by power path 214 to the RSVM cell 204 and a selected SVM cell within the array 202 to heat the RSVM cell 204 and selected array SVM cell.

The power path 214 providing the heating power to the RSVM cell 204 and to the array 202 are substantially the same. Conceptually this is shown as a single power path 214 that is branched to paths 214' and 214". As such, varying the power provided to power path 214 directly results in substantially equal and symmetric variation in the power provided by paths 214' and 214".

Moreover, adjusting the power delivered to RSVM cell 204 results in a substantially symmetric adjustment of power delivered to the array 202. In other words, substantially contemporaneously with the application and adjustment of power to the RSVM cell 204, a power is applied and adjusted to a selected array SVM cell. In at least one embodiment, the power supplied to the selected SVM cell is substantially the identical to the power supplied to the RSVM cell 204. For conceptual simplicity, the RSVM cell 204 has been illustrated as separated from the array 202, however in at least one embodiment the RSVM cell 204 may be located within the array 202.

Figure 3:
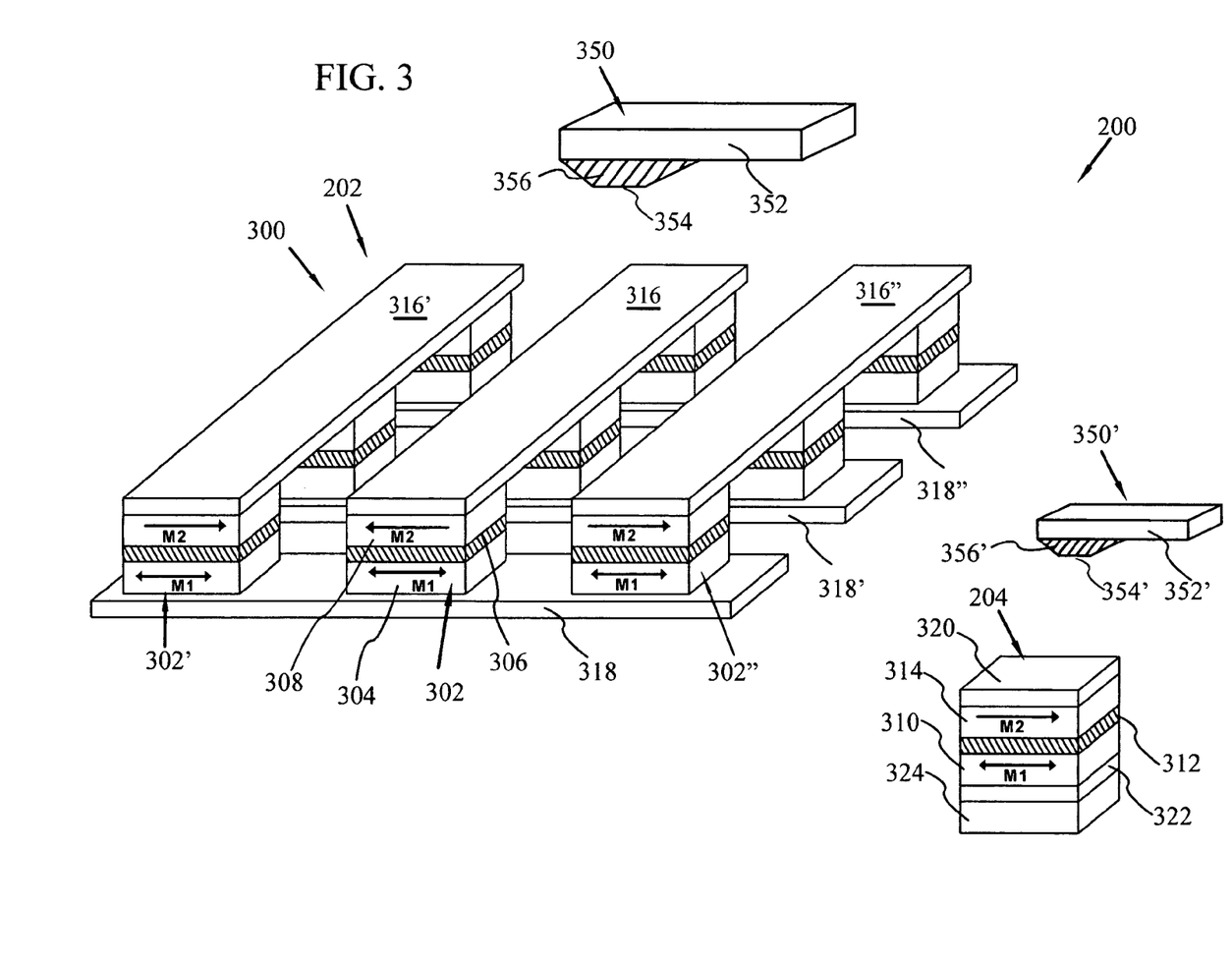
FIG 3 is a partial perspective view of a cross-point array and reference SVM cell as shown in FIG. 2.

FIG. 3 illustrates a perspective view of a portion of the array 202 and RSVM cell 204. As shown, in at least one embodiment, the array 202 is a resistive cross-point memory array (CPA) 300, comprised of spin valve memory (SVM) cells 302, 302', 302", etc. Each SVM cell 302 of the cross-point array 300 includes at least one ferromagnetic data layer 304 (also commonly referred to as a sense layer), an intermediate layer 306, and a ferromagnetic reference layer 308.

The ferromagnetic data layer 304 permits the storing of a bit of data as an alterable orientation of magnetization M1, and consists of a material wherein the coercivity is decreased upon an increase in temperature. The intermediate layer 306 has opposing sides such that the data layer 304 in contact with one side is substantially in direct alignment with, and substantially uniformly spaced from, the reference layer 308.

In at least one embodiment, the reference layer 308 is a pinned reference layer, characterized by a pinned orientation of magnetization M2. In at least one alternative embodiment, the reference layer is a soft-reference layer, characterized by a non-pinned orientation of magnetization M2. A soft-reference layer may also have a lower coercivity than the data layer 304.

The thermal properties of RSVM cell 204 relate to the thermal properties of the SVM cells of the array 202, such that by observing the thermal behavior or RSVM cell 204, the thermal behavior of the SVM cells of the array 202 may be inferred. Under appropriate circumstances RSVM cell 204 may be larger or smaller than the cells of the SVM array 202. When RSVM cell 204 is larger or smaller than the SVM cells of array 202, and, or is not substantially proximate to array 202 it is understood and appreciated that the power applied to RSVM cell 204 corresponds to an adjusted power applied to a selected cell within the array 202.

In at least one embodiment, the RSVM cell 204 is substantially similar to the SVM cells 302, 302', 302", etc. of the cross-point array 300. More specifically, in at least one embodiment the RSVM cell 204 is of substantially the same shape, size and composition as SVM cell 302, having at least one ferromagnetic data layer 310, an intermediate layer 312, and a ferromagnetic reference layer 314, arranged as described with respect to SVM cell 302. Moreover, in at least one embodiment the RSVM cell 204 is substantially idential to the SVM cells 302, 302', 302", etc. of the cross-point array 300. The use of a substantially identical cell advantageously simplifies the manufacturing and control process.

The ferromagnetic data layers (304, 310) and the reference layers (308, 314) may be made from a material that includes, but it not limited to: Nickel Iron (NiFe), Nickel Iron Cobalt (NiFeCo), Cobalt Iron (CoFe), and alloys of such metals. More specifically, in at least one embodiment the data layers (304, 310) and the reference layers (308, 314) are Nickel Iron (NiFe). In addition, both the data layers (304, 310) and the reference layers (308, 314) may be formed from multiple layers of materials. However, for conceptual simplicity and ease of discussion, each layer component is herein discussed as a single layer.

As shown, a plurality of electrically conductive columns 316, 316' and 316" cross a plurality of electrically conductive rows 318, 318' and 318", thereby forming a plurality of intersections. Each SVM cell 302, 302', 302", etc. of the cross-point array 300 is in electrical contact with and located at an intersection between a row and column. As such, electrical current and magnetic fields may be provided to a selected SVM cell 302 within the cross-point array 300 by electrically conductive column 316 and electrically conductive row 318.

Likewise, RSVM cell 204 has a top electrical conductor 320 and a bottom electrical conductor 322. In addition, RSVM cell 204 is thermally coupled to a temperature sensor 324, such as a PN junction diode.

In at least one embodiment, the SVM cells of the cross-point array 300 and the RSVM cell 204 self-heat. More specifically, power flowing through a given SVM cell 302 as provided by column 316 and row 318, and power flowing through the RSVM cell 204 as provided by top electrical conductor 320 and bottom electrical conductor 322, will encounter resistance in the tunneling action of the current through the cell and result in a significant and localized rise in temperature within the SVM cell 302 and RSVM cell 204. The power applied may be a heating pulse of about 1 to 3 volts.

In at least one alternative embodiment, the SVM cells 302, 302', 302", etc. of the cross-point array 300 and the RSVM cell 204 are heated by coupled heating. More specifically, heating power flows through a separate heating device, such as movable nano-tip probe 350 that thermally couples to selected cross-point array SVM cell 302. A substantially identical separate heating device, such as nano-tip probe 350' is also provided to thermally couple to the RSVM cell 204. In at least one embodiment, the nano-tip probe 350 has an articulating support 352, a distal tip 354 and a heat conductor 356.

The nano-tip probe 350' thermally coupling to the RSVM cell 204 is substantially similar, having an articulating support 352', a distal tip 354' and a heat conductor 356'. Under appropriate circumstances, such as where the SVM cells of array 202 share a common bottom conductor, the nano-tip probe 350 may also provide an appropriate top electrical conductor.

Nano-tip probe 350 is movable and as such can be moved from a location proximate to one SVM cell 302 to a location proximate to another SVM cell, such as SVM cell 302'. Specifically, the probe may be positioned along the X and Y coordinate axis above a given SVM cell 302. The probe may then be positioned along the Z coordinate axis to permit the transfer of power (heat and or electrical current) between the nano-tip probe 350 and the selected SVM cell 302.

Figure 4:
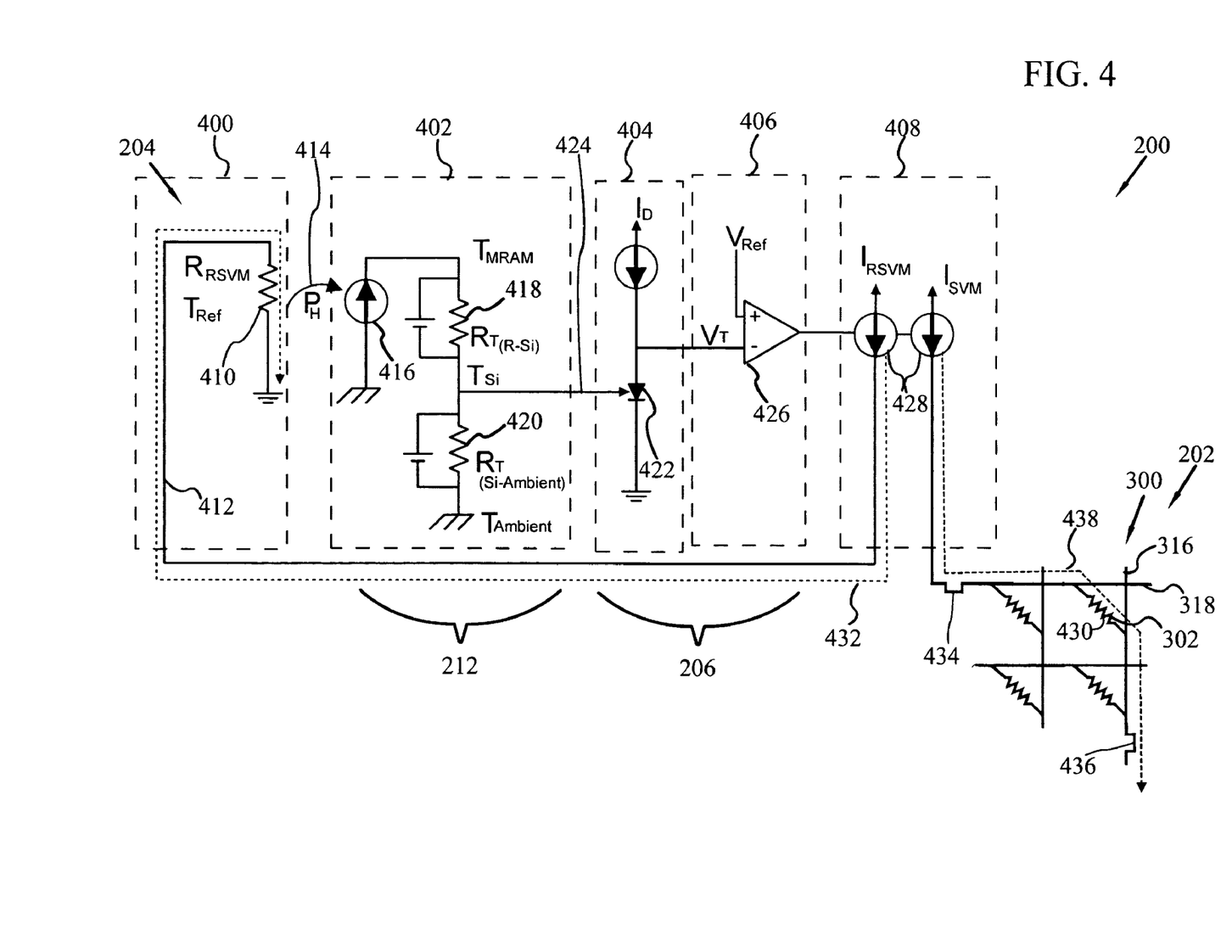
FIG. 4 is a conceptual electrical diagram of the controlled temperature, thermal-assisted magnetic memory device shown in FIG. 2.

FIG. 4 provides a conceptual electrical schematic of the thermal-assisted magnetic memory device 200, characterized by an array 202, an RSVM cell 204, and a feedback controlled temperature controller 206. To assist with discussion, specific elements of this schematic have been set apart by dotted boxes, specifically, the RSVM cell heater 400, the thermal circuit 402 of RSVM cell 204, the temperature sensor 404, the temperature controller 406, and the power source 408. In at least one embodiment, power source 408 is a current mirror.

In this conceptual electrical schematic, the RSVM cell 204 is depicted as a resistive element, 410. As power is provided by conductive line 412 to resistive element 410 (RSVM cell 204), internal resistance results in generation of heat energy, represented as $P_H$, represented by curved arrow 414. The thermal circuit 402 is coupled to the RSVM cell heater 400. More specifically, the power dissipated in resistive element 410 results in a power source for the thermal circuit, as the structure of the circuit determines the thermal resistance and temperature rise as a matter of thermal resistances.

The heat $P_H$, serves as a power source 416 in thermal circuit 402. The thermal resistance ($R_T$) of the RSVM cell 204 to a temperature sensing diode in the silicon substrate is represented by resistor 418. The thermal resistance of the temperature sensing diode to the ambient temperature is represented by resistor 420.

The current flowing through resistors 418 and 420 couples the temperature to the PN junction diode 422 by connection 424. The behavior of the PN junction diode 422 is well understood to respond to temperature, on the order of 2 to 4 micro volts per degree centigrade. The junction voltage developed by the diode current (ID) flowing through the PN junction diode 422, is provided as feedback ($V_T$) to the negative input of a negative feedback differential amplifier 426.

The function of the negative feedback differential amplifier 426 is to reduce the differences between two input voltages. A reference voltage, Vref, is applied to the "+" terminal and the feedback voltage $V_T$ is applied to the "−" terminal. The reference voltage, Vref, represents a specific temperature. In at least one embodiment, Vref represents the temperature for a reduced coercivity of the RSVM cell (i.e., RSVM cell 204). Under appropriate circumstances, Vref may represent operating temperatures desired for a specific application of the thermal-assisted magnetic memory device 200.

The negative feedback differential amplifier 426 reduces the difference between the two input voltages, Vref and $V_T$, by directing an adjustment to the power source 408. In at least one embodiment, the power source 408 is a varying current source 428, providing substantially the same power to resistive element 410 and a selected SVM cell 302, represented as resistive element 430, within array 202, illustrated as cross-point array 300. An increase or decrease in the current (power), provided to the RSVM cell by conductor 412, represented as dotted line 432, is substantially the same as the current (power) provided to resistive element 430 (selected SVM cell 302) of the cross-point array 300. Selected by row select element 434 and column select element 436, the path of the current supplied to resistive element 430 is represented by dotted line 438.

The operation of the thermal-assisted magnetic memory device 200, as conceptually illustrated in FIG. 4, may be summarized as follows: A substantially equal heat power is applied to resistive element 410 and resistive element 430. The heat power dissipated in the resistive element 410 is coupled to a thermal circuit 402. The temperature rise in resistive element 410 above the ambient temperature is recognized and represented by the thermal circuit 402.

The thermal circuit 402 is coupled to an electrical circuit at PN junction diode 422. A sense current is passed through the PN junction diode. The voltage developed by the PN junction diode, $V_T$, is compared to a reference voltage, Vref, by negative feedback differential amplifier 426. Based upon negative feedback, the heat power is adjusted to regulate the feedback voltage $V_T$, to be substantially equal to the reference voltage, Vref. By regulating the power to equalize the voltages, the temperature of the resistive element 410 will be substantially identical to the temperature of the selected resistive element 430.

It is appreciated that the ambient temperature of the RSVM cell 204 is substantially about the same as the ambient temperature of the SVM cells in the array 202. Moreover, the heating behavior illustrated in RSVM cell heater 400 is substantially the same for a resistive element 430 (selected SVM cell 302) within the array 202. Although the RSVM cell heater 400 is illustrated as a function of the applied power being a varying current, it is to be understood and appreciated that the power may be an applied voltage, a high frequency (RF) power, laser or other form of power sufficient to provide a localized source of heat.

The thermal-assisted magnetic memory device 200 with feedback controlled temperature controller 206 advantageously permits reliable thermal-assisted write operations depending on elevated temperatures of the selected SVM cells. Such thermal-assisted operations are controlled to a very narrow and precise temperature range. Moreover, variations in ambient temperature (i.e., the substrate temperature) affecting the final temperature of the array SVM cells is effectively eliminated. This elimination is advantageously accomplished without requiring each SVM cell of the array 202 to be fitted with an individual temperature sensor.

Having described the above physical embodiment of the thermal-assisted magnetic memory device 200 with RSVM cell 204 and feedback controlled temperature controller 206, another embodiment relating to the method of use will now be described with reference to the Flowchart of FIG. 5 and the components illustrated in FIGS. 2, 3 and 4. It will be appreciated that the described method need not be performed in the order in which it is herein described, but that this description is merely exemplary of at least one method for using the controlled temperature, thermal-assisted magnetic memory device 200, in accordance with the present invention.

Figure 5:
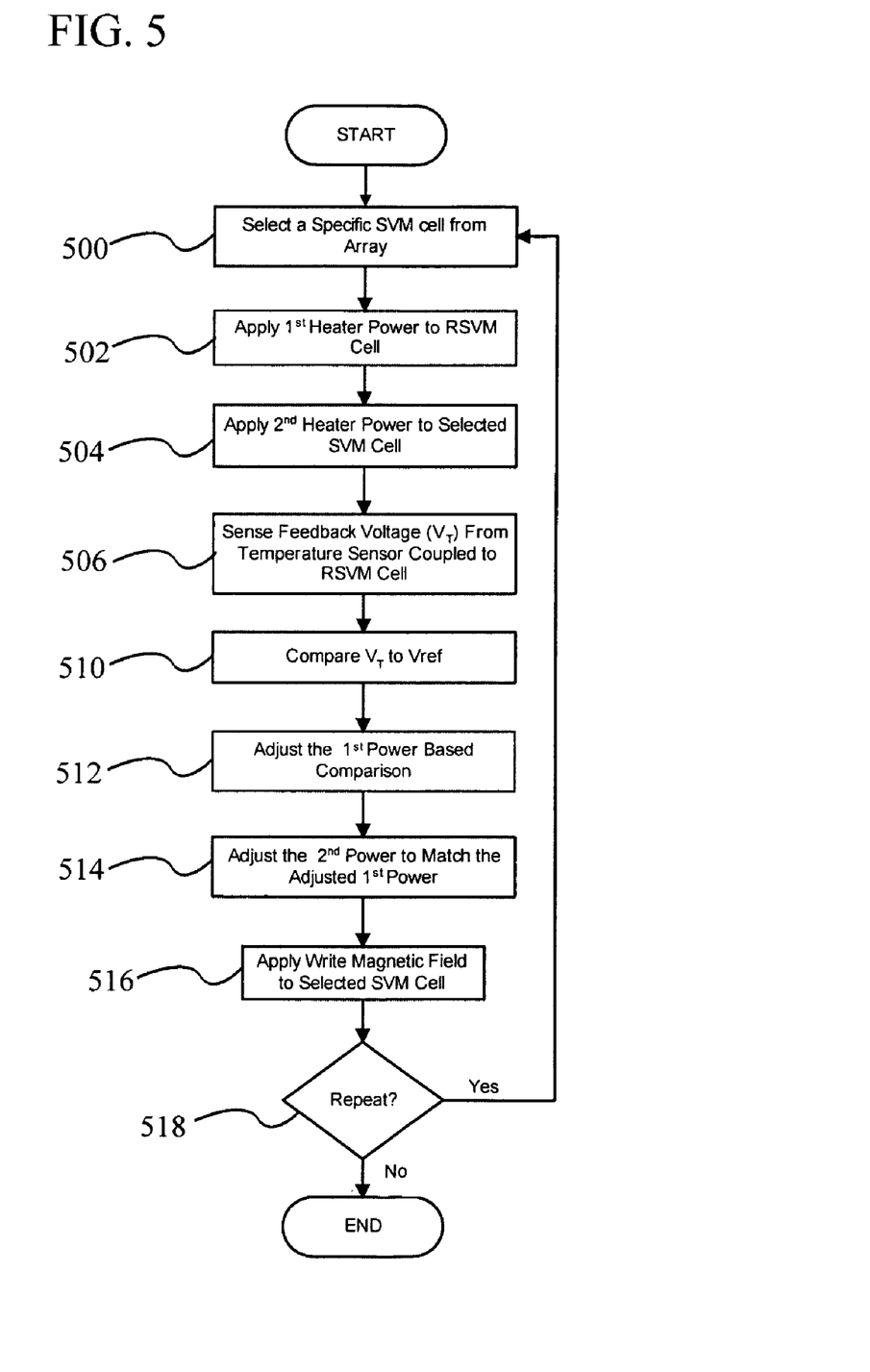
FIG. 5 is a flowchart depicting the steps of using the controlled temperature, thermal-assisted magnetic memory device as shown in FIGS. 2, 3 and 4.

Referring to the components illustrated in FIGS. 3 and 4, and as indicated in the Flowchart of FIG. 5, the selection of a specific SVM cell is made, block 500. Such a selection may be performed with the use of row select element 434 and column select element 436 selecting a specific column 316 and specific row 318 to select a specific SVM cell 302.

A first power is applied to RSVM cell 204. The first power is a heating power and the application serves to heat the RSVM cell 204, block 502. A second power, substantially identical to the first power, is applied to the selected resistive element 430 (selected SVM cell 302), block 504.

In at least one embodiment the application of the first and second powers results in self-heating within the RSVM cell 204 and selected resistive element 430. In an alternative embodiment, the heating is achieved by coupled heating, wherein the first and second powers are applied to separate heating devices that are thermally coupled to RSVM cell 204 and selected resistive element 430.

It is generally appreciated in the magnetic memory arts that as the size of a magnetic bit decreases, the coercivity of the bit will increase. For example, a 0.25×0.75 micrometer bit may have a coercivity of about 40 Oe [1 Oe=1000/(4*pi) A/m], whereas a 0.15×0.45 micrometer bit may have a coercivity of about 75 Oe [1 Oe=1000/(4*pi) A/m]. In general, the coercivity of a material will decrease as temperature increases. For example a 100 degrees Celsius rise in temperature may impart a drop in coercivity of about 50%. Upon a decrease in temperature to the original state, the original coercivity will generally return.

As such, applying a heating power to the RSVM cell 204 will reduce the coercivity of RSVM cell 204. As RSVM cell 204 is substantially identical to the SVM cells of the array 202, by measuring and controlling the temperature of resistive element 410 (RSVM cell 204), it is possible to infer substantially the same control of temperature applied to the selected resistive element 430 (selected SVM cell 302).

To permit this control of temperature, a feedback voltage $V_T$, is sensed from the temperature controller 206 coupled to the RSVM cell 204, block 506. The feedback voltage $V_T$ is compared to reference voltage Vref, block 510. The reference voltage, Vref, represents a specific temperature, and in at least one embodiment represents the reduced coercivity of RSVM cell 204 and selected SVM cell 302.

Based upon the comparison of $V_T$ to Vref, the negative feedback differential amplifier 426 adjusts the variable first power applied to the RSVM cell 204, block 512. As the power is supplied by power source 408, the second power applied to the resistive element 430 is likewise adjusted to be substantially identical to the first power, block 514.

With the desired temperature achieved in the RSVM cell 204 and, by implication, in the selected SVM cell 302, a write magnetic field is applied to the selected SVM cell 302, block 516. The magnetic field applied is greater than the reduced coercivity of the selected SVM cell 302. As the coercivity of the resistive element 430 (selected SVM cell 302) has been reduced by the application of power in the form of heat, the orientation of magnetization of the selected SVM cell 302 may be changed. Appropriate sensing operations may be combined with the write operation to confirm the write operation has succeeded.

As indicated in decision operation 518, additional write operations repeat the above described method. This method advantageously permits accurate thermal-assist write operations to be performed. As such, the margins of buffering space between SVM cells within the array 202 may be reduced.

Another embodiment may be appreciated to be a computer system incorporating the thermal-assisted magnetic memory device 200. A computer with a main board, at least one CPU and the thermal-assisted magnetic memory device 200, as described above with reference to FIG. 4, raises the advantages of the improved thermal-assisted magnetic memory device 200 to a system level.

While the invention has been described with reference to the preferred embodiment, it will be understood by those skilled in the art that various alterations, changes and improvements may be made and equivalents may be substituted for the elements thereof and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

We claim:

1. A controlled temperature, thermal-assisted magnetic memory device comprising:
    an array of SVM cells, the SVM cells characterized by an alterable orientation of magnetization and comprising a material wherein the coercivity is decreased upon an increase in temperature;
    at least one reference SVM cell; and
    a feedback controlled temperature controller receiving a reference voltage and further receiving a feedback voltage from the reference SVM cell when power is applied to the reference SVM cell and a selected array SVM cell to heat the reference SVM cell and the selected array SVM cell, the feedback controlled temperature controller adjusting the applied power to minimize the difference between the feedback voltage and reference voltage.

2. The controlled temperature, thermal-assisted magnetic memory device of claim 1, wherein the at least one reference SVM cell is substantially identical to the SVM cells of the array.

3. The controlled temperature, thermal-assisted magnetic memory device of claim 1, wherein the at least one reference SVM cell is positioned within close proximity to the array.

4. A controlled temperature, thermal-assisted magnetic memory device comprising:
    an array of SVM cells, the SVM cells characterized by an alterable orientation of magnetization and comprising a material wherein the coercivity is decreased upon an increase in temperature;
    at least one reference SVM cell substantially similar to the SVM cells of the array, the reference SVM cell positioned within close proximity to the array; and
    a feedback controlled temperature controller receiving a reference voltage and receiving a feedback voltage from the reference SVM cell when power is applied to the reference SVM cell and a selected array SVM cell to heat the reference SVM cell and the selected array SVM cell, the feedback controlled temperature controller adjusting the applied power to minimize the difference between the feedback voltage and reference voltage.

5. The controlled temperature, thermal-assisted magnetic memory device of claim 4, wherein the at least one reference SVM cell is substantially identical to the SVM cells of the array.

6. The controlled temperature, thermal-assisted magnetic memory device of claim 4, wherein the ambient temperature of the reference SVM cell is substantially about the same as the ambient temperature of the array of SVM cells.

7. The controlled temperature, thermal-assisted magnetic memory device of claim 4, wherein the reference SVM cell is located within the array.

8. The controlled temperature, thermal-assisted magnetic memory device of claim 4, wherein the reference voltage represents a specific temperature.

9. The controlled temperature, thermal-assisted magnetic memory device of claim 4, wherein the reference voltage represents temperature for a reduced coercivity of the reference SVM cell.

10. The controlled temperature, thermal-assisted magnetic memory device of claim 4, wherein the feedback controlled temperature controller further includes a negative feedback differential amplifier receiving the reference voltage and the feedback voltage.

11. The controlled temperature, thermal-assisted magnetic memory device of claim 4, wherein the applied power is a heating power.

12. The controlled temperature, thermal-assisted magnetic memory device of claim 4, wherein the applied power is selected from a varying current, a varying voltage, or high frequency (RF) power, or laser power.

13. The controlled temperature, thermal-assisted magnetic memory device of claim 4, wherein the reference SVM cell and selected array SVM cell self-heat by the power flowing through the reference SVM cell and selected array SVM cell.

14. The controlled temperature, thermal-assisted magnetic memory device of claim 4, wherein the reference SVM cell and selected array SVM cell are heated by coupled heating, wherein heating power flows through a separated heating device thermally coupled to the reference SVM cell and selected array SVM cell.

15. The controlled temperature, thermal-assisted magnetic memory device of claim 4, wherein the array is a cross-point array including:
   a plurality of parallel electrically conductive rows; and
   a plurality of parallel electrically conductive columns crossing the rows, each thereby forming a cross-point array with a plurality of intersections;
   wherein each SVM cell of the cross-point array is in electrical contact with and located at an intersection between a row and column.

16. The controlled temperature, thermal-assisted magnetic memory device of claim 4, wherein the reference SVM cell is thermally coupled to a temperature sensor.

17. The controlled temperature, thermal-assisted magnetic memory device of claim 16, wherein the reference SVM cell is physically coupled to the temperature sensor.

18. The controlled temperature, thermal-assisted magnetic memory device of claim 16, wherein the temperature sensor is a PN junction diode.

19. The controlled temperature, thermal-assisted magnetic memory device of claim 16, further including a circuit for heating a selected array SVM cell during a write operation on the selected array SVM cell, the circuit:
   applying substantially the same power to the reference SVM cell and the selected array SVM cell;
   sensing a feedback voltage from the temperature sensor coupled to the reference SVM cell;
   adjusting the power applied to the reference SVM cell and the selected array SVM cell to minimize the difference between the feedback voltage and the reference voltage; and
   applying a magnetic field to the selected array SVM cell;
   wherein the orientation of magnetization of the selected array SVM cell may be changed, the magnetic field being greater than the coercivity of the heated selected array SVM cell.

20. A controlled temperature, thermal-assisted magnetic memory device comprising:
   a plurality of parallel electrically conductive rows;
   a plurality of parallel electrically conductive columns crossing the rows, thereby forming a cross-point array with a plurality of intersections;
   a plurality of SVM cells, each SVM cell in electrical contact with and located at an intersection between a row and column, each SVM cell comprising a material wherein the coercivity is decreased upon an increase in temperature;
   at least one reference SVM cell substantially similar to the SVM cells of the cross-point array, the reference SVM cell positioned in close proximity to the cross-point array;
   at least one temperature sensor thermally coupled to each at least one reference SVM cell; and
   a feedback controlled temperature controller receiving a reference voltage and receiving a feedback voltage from at least one temperature sensor when power is applied to the sensor coupled reference SVM cell, the feedback controlled temperature controller adjusting the applied power to minimize the difference between the feedback voltage and the reference voltage;
   wherein substantially contemporaneously with the application and adjustment of power to the reference SVM cell, a substantially identical power is applied and adjusted to a selected cross-point array SVM cell.

21. The controlled temperature, thermal-assisted magnetic memory device of claim 20, wherein the at least one reference SVM cell is substantially identical to the SVM cells of the array.

22. The controlled temperature, thermal-assisted magnetic memory device of claim 20, wherein the ambient temperature of the reference SVM cell is substantially about the same as the ambient temperature of the array of SVM cells.

23. The controlled temperature, thermal-assisted magnetic memory device of claim 20, wherein the reference SVM cell is located within the array.

24. The controlled temperature, thermal-assisted magnetic memory device of claim 20, wherein the reference voltage represents a specific temperature.

25. The controlled temperature, thermal-assisted magnetic memory device of claim 20, wherein the feedback controlled temperature controller further includes a negative feedback differential amplifier receiving the reference voltage and the feedback voltage.

26. The controlled temperature, thermal-assisted magnetic memory device of claim 20, wherein the applied power is a heating power.

27. The controlled temperature, thermal-assisted magnetic memory device of claim 20, wherein the reference SVM cell and selected array SVM cell self-heat by the power flowing through the reference SVM cell and selected array SVM cell.

28. The controlled temperature, thermal-assisted magnetic memory device of claim 20, wherein the reference SVM cell and selected array SVM cell are heated by coupled heating, wherein heating power flows through a separated heating device thermally coupled to the reference SVM cell and selected array SVM cell.

29. The controlled temperature, thermal-assisted magnetic memory device of claim 20, wherein the temperature sensor is a PN junction diode.

30. The controlled temperature, thermal-assisted magnetic memory device of claim 20, further including a circuit for heating a selected array SVM cell during a write operation on the selected array SVM cell, the circuit:
   applying substantially the same power to the reference SVM cell and the selected array SVM cell;
   sensing a feedback voltage from the temperature sensor coupled to the reference SVM cell;
   adjusting the power applied to the reference SVM cell and the selected array SVM cell to minimize the difference between the feedback voltage and the reference voltage; and
   applying a magnetic field to the selected array SVM cell;
   wherein the orientation of magnetization of the selected array SVM cell may be changed, the magnetic field being greater than the coercivity of the heated selected array SVM cell.

31. The controlled temperature, thermal-assisted magnetic memory device of claim 20, wherein the reference SVM cell and array SVM cells each include:
   at least one ferromagnetic data layer characterized by an alterable orientation of magnetization, the ferromagnetic data layer comprising a material wherein the coercivity is decreased upon an increase in temperature;
   an intermediate layer in contact with the data layer; and
   at least one ferromagnetic reference layer in contact with the intermediate layer, opposite from the data layer.

32. The controlled temperature, thermal-assisted magnetic memory device of claim 31, wherein the reference layer is a soft-reference layer.

33. A method of performing a write operation on a selected SVM cell in a controlled temperature, thermal-assisted magnetic memory device consisting of an array of SVM cells wherein their coercivity is decreased upon an increase in temperature, a reference SVM cell substantially similar to and in close proximity to the array, and a feedback controlled temperature controller having a temperature sensor thermally coupled to the reference SVM cell, the method comprising:
- selecting a specific SVM cell from the array;
- applying a first power to the reference SVM cell, the first power heating the reference SVM cell;
- applying a second power, substantially identical to the first power, to the selected SVM cell, the second power heating selected SVM cell;
- sensing a feedback voltage from the temperature sensor coupled to the reference SVM cell;
- comparing the feedback voltage to a reference voltage;
- adjusting the first power applied to the reference SVM cell to minimize the difference between the feedback voltage and the reference voltage;
- adjusting the second power applied to the selected SVM cell to be substantially identical to the adjusted first voltage; and
- applying a magnetic field to the selected SVM cell;
- wherein the orientation of magnetization of the selected array SVM cell may be changed, the magnetic field being greater than the coercivity of the heated selected array SVM cell.

34. The method of claim 33, wherein the array is a cross-point array.

35. The method of claim 33, wherein the reference voltage represents a specific temperature.

36. The method of claim 33, wherein the reference voltage is predetermined.

37. The method of claim 33, wherein the reference voltage represents the temperature for a reduced coercivity of the selected SVM cell and reference SVM cell.

38. The method of claim 33, wherein the reference SVM cell and selected SVM cell self heat by the applied first power flowing through the reference SVM cell and the second power flowing through the selected SVM cell.

39. The method of claim 33, wherein the reference SVM cell and selected SVM cell are heated by coupled heating, wherein the first power flows through a separated heating device thermally coupled to the reference SVM cell and the second power flows through a separated heating device thermally coupled to the selected SVM cell.

40. The method of claim 33, wherein the ambient temperature of the reference SVM cell is substantially the same as the ambient temperature of the array of SVM cells.

41. The method of claim 33, wherein the reference SVM cell is within the array.

42. A computer system comprising:
- a main board;
- at least one central processing unit (CPU) coupled to the main board; and
- at least one memory store joined to the CPU by the main board, the memory store including;
  - an array of SVM cells, the SVM cells characterized by an alterable orientation of magnetization and comprising a material wherein the coercivity is decreased upon an increase in temperature;
  - at least one reference SVM cell substantially similar to the SVM cells of the array, the reference SVM cell positioned within close proximity to the array;
  - at least one temperature sensor thermally coupled to each at least one reference SVM cell; and
  - a feedback controlled temperature controller receiving a reference voltage and feedback voltage from at least one temperature sensor when power is applied to the sensor coupled reference SVM cell and a selected array SVM cell to heat the reference SVM cell and a selected array SVM cell, the feedback controlled temperature controller adjusting the applied power to minimize the difference between the feedback voltage and reference voltage.

43. The computer system of claim 42, wherein the ambient temperature of the reference SVM cell is substantially about the same as the ambient temperature of the array of SVM cells.

44. The computer system of claim 43, wherein the reference voltage represents a specific temperature.

45. The computer system of claim 43, wherein the applied power is a heating power.

* * * * *